United States Patent [19]

Taylor

[11] Patent Number: 4,567,151
[45] Date of Patent: Jan. 28, 1986

[54] BINDER GLASS OF $Bi_2O_3$-$SiO_2$-$GeO_2$ (-PBO OPTIONAL) ADMIXED WITH ZNO/ZNO AND $Bi_2O_3$

[75] Inventor: Barry E. Taylor, Youngstown, N.Y.

[73] Assignee: E. I. Du Pont de Nemours and Company, Wilmington, Del.

[21] Appl. No.: 690,885

[22] Filed: Jan. 14, 1985

Related U.S. Application Data

[62] Division of Ser. No. 639,384, Aug. 10, 1984, Pat. No. 4,532,075.

[51] Int. Cl.$^4$ .............................. C03C 3/04; C03C 3/12
[52] U.S. Cl. .......................................... 501/15; 501/17; 501/42; 501/73; 501/74
[58] Field of Search .................. 501/42, 74, 73, 17, 501/15, 904, 41; 252/518, 514

[56] References Cited

U.S. PATENT DOCUMENTS

| | | | |
|---|---|---|---|
| 2,898,395 | 8/1959 | Schurecht | 501/15 |
| 3,723,141 | 3/1973 | Dumbaugh | 501/904 |
| 4,235,644 | 11/1980 | Needes | 252/514 |
| 4,255,291 | 3/1981 | Needes et al. | 252/512 |
| 4,414,143 | 11/1983 | Felten | 252/519 |

FOREIGN PATENT DOCUMENTS

| | | | |
|---|---|---|---|
| 436033 | 7/1974 | U.S.S.R. | 501/74 |
| 587110 | 1/1978 | U.S.S.R. | 501/73 |

OTHER PUBLICATIONS

Rawson, H.–*Inorganic Glass Forming Systems*–pub. by Academic Press, London & NY, (1967) pp. 178, 206.

*Primary Examiner*—Helen M. McCarthy

[57] ABSTRACT

A thick film conductor composition comprising an admixture of finely divided particles of noble metal and inorganic binder dispersed in organic medium in which the inorganic binder consists essentially of a bismuth silicate glass and/or bismuth germanate glass, ZnO and optionally $Bi_2O_3$.

3 Claims, No Drawings

BINDER GLASS OF $Bi_2O_3$-$SiO_2$-$GeO_2$ (-PBO OPTIONAL) ADMIXED WITH ZNO/ZNO AND $Bi_2O_3$

This is a division of application Ser. No. 639,384, filed Aug. 10, 1984 now U.S. Pat. No. 4,532,075.

FIELD OF INVENTION

The invention relates to thick film conductor compositions and especially to such compositions having good solderability and adhesion to the substrates on which they are employed.

BACKGROUND OF THE INVENTION

The use of thick film conductors in hybrid microelectronic components is well known in the electronic field. Such materials are usually comprised of a dispersion of finely divided particles of a noble metal, noble metal alloy or mixtures thereof and a minor amount of inorganic binder, both dispersed in an organic medium to form a pastelike product. Such pastes are usually applied to an inert substrate such as $Al_2O_3$ by screen printing to form a patterned layer. The patterned thick film conductor layer is then fired to volatilize the organic medium and sinter the inorganic binder, which is usually glass or a glass-forming material. In addition to the electrical conductivity properties which the fired layer must possess, it is essential that it adhere firmly to the substrate on which it is printed and that the layer be capable of accepting solder. Solderability is, of course, essential because of the necessity of connecting the conductive pattern with other components of the electronic system in which it is used, e.g., resistor and capacitor networks, resistors, trim potentiometers, chip resistors, chip capacitors, chip carriers and the like.

Though extensive research has been directed to the problem of thick film conductor adhesion and solderability, the increasingly more stringent technical demands on such conductor systems require that still further improvements be made.

BRIEF DESCRIPTION OF THE INVENTION

The invention is directed in its primary aspect to a printable thick film conductor composition comprising an admixture of:

A. 60-99% wt. finely divided particles of noble metal, noble metal alloy or mixtures thereof, and
B. 40-1% wt. inorganic binder consisting essentially of finely divided particles of (1) 100 parts of a glass corresponding to the formula $Bi_4Si_{3-x}Ge_xO_{12}$, when x=0-3, having dissolved therein 0-20 pph PbO, basis glass, (2) 0-100 pph $Bi_2O_3$, basis glass and PbO, and (3) 4-100 pph ZnO, basis glass and PbO dispersed in
C. An organic medium.

In a second aspect, the invention is directed to ceramic substrates having printed thereon a patterned layer of the above described thick film conductor composition which has been fired to effect volatilization of the organic medium and sintering of the glass.

In a third aspect, the invention is directed to a novel glass composition corresponding to the formula $Bi_4Si_{3-x}Ge_xO_{12}$, wherein x is 0.1-2.9.

PRIOR ART

U.S. Pat. No. 4,255,291 to Needes discloses a class of lead bismuthate glass frits comprising by weight 10-85% PbO, $Bi_2O_3$ or mixture thereof, 1-20% CdO, $SiO_2$, $B_2O_3$ or mixtures thereof, and 0-10% of $Na_2O$, $K_2O$, $Al_2O_3$, CaO, $TiO_2$, $Li_2O$, ZnO or mixtures thereof. The frits actually disclosed contain 12.5% $B_2O_3$ in addition to other oxides such as $Al_2O_3$, CdO and $Na_2O$. The glass frits are for use as binders for aluminum-containing metal conductors which are fired in air.

U.S. Pat. No. 4,235,644 to Needes discloses a class of lead bismuthate glass frit comprising by weight at least 60% $Bi_2O_3$ which optionally may also contain PbO, $SiO_2$ and $B_2O_3$. A preferred composition is disclosed to contain 3-30% PbO and 1-10% each of $SiO_2$ and $B_2O_3$. The frits actually disclosed contain 3.5-10% $B_2O_3$ in addition to other oxides such as $Al_2O_3$, CdO, $Na_2O$, $TiO_2$, TiO, $ZrO_2$ and ZnO.

DETAILED DESCRIPTION OF THE INVENTION

A. Conductive Phase

Any of the noble metals, their alloys or mixtures thereof may be used as the conductive phase for the composition of the invention. Thus, noble metals such as Ag, Pt and Pd can be used as can their alloys such as Pt/Au, Pd/Ag, Pd/Au and Ag/Pt/Pd.

The noble metal particles, as well as the other solids of the composition of the invention, preferably have a size within the range of 0.5-10 $\mu$m and a surface area of 1-12 $m^2/g$. Though these ranges are preferred, it should be recognized that these limits are not narrowly critical to the effectiveness of the compositions in use.

The amount of noble metal in the composition relative to total solids will fall within the range of 60-99% wt. of the composition, excluding the organic medium. Most compositions will, however, contain on the order of 75-98% wt. noble metal and complementally 25-2% wt. inorganic binder.

B. Inorganic Binder

As described hereinabove, the inorganic binder phase of the compositions of the invention contains as a principal component a glass corresponding to the formula $Bi_4Si_{3-x}Ge_xO_{12}$, wherein x is 0-3, having dissolved therein 0-100 pph, basis glass, of PbO. It is preferred that the amount of germanium in the glass correspond to x values of 0.1-2.9 and more preferably 0.2-2 and still more preferably 0.5-1.5. The glass contains no boron.

Unlike the ZnO and the optional excess $Bi_2O_3$, it is essential that when PbO is used in the glass composition, it must be dissolved in the glass to avoid solderability problems. It cannot effectively be added merely as a further solids component.

The use of PbO in the glass is optional so long as the glass contains some germanium. But to get adequate adhesion it becomes essential if no germanium is contained in the glass, i.e., when x=0. It is, nevertheless, preferred to employ 1-20 and preferably 2-10 pph PbO, basis glass, in all compositions.

The glass component of the inorganic binder is prepared by conventional glassmaking techniques by mixing the desired components in the desired proportions and heating the mixture to form a melt. As is well known in the art, heating is conducted to a peak temperature and for a time such that the melt becomes entirely liquid and homogeneous.

In the present work, the component oxides are mixed in any of several ways familiar to those in the art and then melted in a Kyanite ® crucible at 1350° C. for 10–30 minutes. The homogeneous molten glass is then poured into cold water in order to quench the amorphous glass structure. The coarse glass is then placed in a ceramic jar mill with an appropriate amount of water and ceramic media to give efficient size reduction. Milling times of 20–70 hours were generally found to give adequate size reduction.

After discharging the milled frit slurry from the mill, the excess water is removed by decantation and the frit powder is oven dried at a temperature of 150° C. The dried powder is then screened through a 325-mesh stainless steel screen to remove any large particles.

In addition to the glass, which may have PbO dissolved therein, the inorganic component must also contain ZnO and optionally may contain additional $Bi_2O_3$. However, these two components, unlike the PbO, must not be dissolved in the glass. To the contrary, they must be added as separate particulate solids. Thus the inorganic binder consists essentially of an admixture of (1) particles of glass in which PbO is dissolved if it is used at all, (2) ZnO particles and optionally (3) $Bi_2O_3$ particles if they are used at all.

It has been found that at least 4 pph ZnO must be used in the inorganic binder to obtain adequate adhesion and at least 10 pph are preferred. However, if more than about 100 pph are used, solderability is degraded and resistivity tends to be raised.

Even though the addition of $Bi_2O_3$ is not essential, it is nevertheless preferred to use at least 10 pph of $Bi_2O_3$ to improve solderability still further. However, if more than about 100 pph are used, the composition tends to lose adhesion.

As discussed hereinabove, the inorganic binder portion of the invention may comprise as little as 1% wt. of the total solids and as much as 40% wt. However, more frequently the amount of inorganic binder will be 2–25% wt. of the total solids and especially 5–15% wt.

C. Organic Medium

A further important component of the compositions in accordance with the invention is the organic medium. The main purpose of the organic medium is to serve as a vehicle for dispersion of the finely divided solids of the composition in such form that it can readily be applied to ceramic or other substrates. Thus, the organic medium must first of all be one in which the solids are dispersible with an adequate degree of stability. Secondly, the rheological properties of the organic medium must be such that they lend good application properties to the dispersion.

Most thick film compositions are applied to a substrate by means of screen printing. Therefore, they must have appropriate viscosity so that they can be passed through the screen readily. In addition, they should be thixotropic in order that they set up rapidly after being screened, thereby giving good resolution. While the rheological properties are of primary importance, the organic medium is preferably formulated also to give appropriate wettability of the solids and the substrate, good drying rate, dried film strength sufficient to withstand rough handling, and good firing properties. Satisfactory appearance of the fired composition is also important.

In view of all these criteria, a wide variety of liquids can be used as organic medium. The organic medium for most thick film compositions is typically a solution of resin in a solvent frequently also containing thixotropic agents and wetting agents. The solvent usually boils within the range of 130°–350° C.

By far the most frequently used resin for this purpose is ethyl cellulose. However, resins such as ethylhydroxyethyl cellulose, wood rosin, mixtures of ethyl cellulose and phenolic resins, polymethacrylates of lower alcohols, and monobutyl ether of ethylene glycol monoacetate can also be used.

Suitable solvents include kerosene, mineral spirits, dibutylphthalate, butyl carbitol, butyl carbitol acetate, hexylene glycol and high-boiling alcohols and alcohol esters. Various combinations of these and other solvents are formulated to obtain the desired viscosity, volatility and compatibility with dielectric tape. Water-soluble solvent systems can also be used.

Among the thixotropic agents which are commonly used are hydrogenated castor oil and derivatives thereof and ethyl cellulose. It is, of course, not always necessary to incorporate a thixotropic agent since the solvent/resin properties coupled with the shear thinning inherent in any suspension may alone be suitable in this regard. Suitable wetting agents include phosphate esters and soya lecithin.

The ratio of organic medium to solids in the paste dispersions can vary considerably and depends upon the manner in which the dispersion is to be applied and the kind of organic medium used. Normally, to achieve good coverage, the dispersions will contain complementally by weight 40–90% solids and 60–10% organic medium.

The pastes are conveniently prepared on a three-roll mill. The viscosity of the pastes is typically 2–50 Pa.s when measured at room temperature on Brookfield viscometers at low, moderate and high shear rates. The amount and type of organic medium (vehicle) utilized is determined mainly by the final desired formulation viscosity and print thickness.

In many instances, the organic medium does not play an important role in the functional properties of the microcircuit conductor. However, with respect to the composition of the invention, it has been found that the organic medium can have a significant role in determining conductor performance. Thus the wrong choice of organic vehicle can result in high resistivity and poor aged adhesion of the fired conductor film. To avoid these potential problems, the organic vehicle must give excellent dispersion and must burn out cleanly at a low temperature (400°–450° C.) in the firing cycle.

In view of these criteria, a preferred vehicle system for the present invention consists of ethyl cellulose polymers dissolved in a mixture of β-terpineol, dibutyl carbitol, and dibutylphthalate solvents. A thixotropic agent is generally added to give improved line resolution with screen printing.

D. Formulation and Application

The compositions of the present patent are pastes composed of inorganic oxides and glass powders, precious metal powders such as silver, palladium, platinum and gold, and an organic vehicle which is used to disperse the oxides, glass and metal powders. The resultant material should be easily screen printable by techniques commonly used in the electronics industry. The various powders and organic vehicle are first blended by using commercial blending equipment such as a Hobart ® mixer, and then sufficiently dispersed on a three-roll mill. The resultant paste is often screened through a 325–400 mesh stainless steel screen to remove any metal flakes which might have resulted from the roll milling operation.

E. Test Procedures

Aged Adhesion: The adhesion after thermal aging is determined as follows. Parts are printed on 96% alumina substrates such as Alsimag ® 614 (tradename of 3M Company, Minneapolis, Minn. for aluminum magnesium silicon oxides). The screen used generally is a 200-mesh screen with 1.6–2.1 mil diameter stainless steel mesh. The wire is mounted so that the mesh wires run parallel to the frame of the screen. The pattern is defined by a pattern photoimaged on an emulsion applied to the mesh and developed chemically to form a stencil through which the thick film paste is applied to the substrate. The pattern for the adhesion test has nine pads, each 80 mils square, arranged to form a 3×3 grid of pads on a 1"×1" substrate. The photographic emulsion generally extends 0.5–1.0 mil below the wire mesh on the bottom of the screen to allow a thicker print and to seal off the pattern at the substrate surface to provide better resolution. The screen printer is generally set to have a 25 mil gap between the screen and the substrate to be printed upon.

The squeegee that forces paste through the stencil is made of hard rubber or a synthetic material such as Viton ® fluoroelastomer of 50–90 durometer hardness rating. (Viton ® is a registered trademark of E. I. du Pont de Nemours and Company, Inc., Wilmington, Del.) Downward pressure, typically about 1 pound per inch of squeegee length, is exerted on the squeegee. The squeegee sweeps ink across the pattern at 3–10 inches/second typically.

The printed parts are dried 5–15 minutes at 80°–150° C. They are then fired five times in a belt furnace which has a 10 minute peak temperature cycle at 850° C., plus a 20 minute ramp of increasing temperature from room temperature to the maximum of 850° C. and a 30 minute descending temperature ramp back down from 850° C. to ambient.

After firing five times, the parts have wires attached as follows. Wires are clipped onto the substrate so that they each run down the center of three pads. Then the wires/fired parts are dipped into Alpha 611 solder flux. The parts are then prewarmed on the solder bath and dipped for 10 seconds and allowed to cool. Residual solder flux is cleaned from the soldered wired parts with a $CH_2Cl_2$/methanol mixture. Parts are placed in an oven at 150° for 48 hours, then removed and cooled.

The aged parts are placed in an apparatus for measuring the force necessary to separate the wire from the substrate. The force necessary is recorded. Also, the type of separation is noted, i.e., whether separation involves the wire pulling out of the solder pulls off the substrate. Over 15 newtons indicates good adhesion and over 20 newtons is excellent adhesion. Adhesion values of 12–14 newtons are marginal and below 12 is unacceptable.

Solderability: Using a paste formulated in the manner described above, a ⅞ inch×⅞ inch (2.2×2.2 cm) pattern is printed upon a 96% alumina substrate (Alsimag ® 614) and then dried and fired in the manner described above for the aged adhesion test. The printed and fired substrate is dipped into solder flux (Alpha 611) to coat the substrate. The fluxed substrate is then heated briefly (ca. 2 seconds) over a solder pot which contains 62/36/2 Sn/Pb/Ag solder heated to 220° C. After heating, the substrate is immersed into the solder for 5 seconds, removed and rinsed with a solution of methanol and methylene chloride. The solderability of the substrate is then evaluated by visual examination using the following criteria:

| | | |
|---|---|---|
| Excellent (E) | Total coverage | 100% Solder Area |
| Very Good (V) | Few pinholes in pattern | 98–99% |
| Good (G) | Few Pinholes in pattern plus 1 or 2 unsoldered areas on the pad | 96–97% |
| Fair (F) | Several unsoldered areas on the pads | 92–95% |
| Poor (P) | 10% or more unsoldered | 90% |

In the examples which follow, several different glass compositions were tested. In Table 1 are listed glasses of the $Bi_2O_3.SiO_2.PbO$ type. In Table 2 are listed glasses of the $Bi_2O_3.SiO_2.GeO_2$ type, and in Table 3 are listed glasses of the $Bi_2O_3.SiO_2.GeO_2.PbO$ type.

TABLE 1
COMPOSITION OF $Bi_2O_3.SiO_2.PbO$ GLASSES

| | Weight % of Oxide | | | | |
|---|---|---|---|---|---|
| | A | B | C | D | Control |
| $Bi_2O_3$ | 81.6 | 79.5 | 77.5 | 75.6 | 83.8 |
| $SiO_2$ | 15.8 | 15.4 | 15.0 | 14.6 | 16.2 |
| PbO | 2.6 | 5.1 | 7.5 | 9.8 | — |

TABLE 2
COMPOSITION OF $Bi_2O_3.SiO_2.GeO_2$ GLASSES

| | Weight % of Oxide | | | | | | | |
|---|---|---|---|---|---|---|---|---|
| | A | B | C | D | Control | F | G | H |
| $Bi_2O_3$ | 83.46 | 83.13 | 82.15 | 81.35 | 79.05 | 77.58 | 76.17 | 74.81 |
| $SiO_2$ | 15.60 | 15.01 | 13.24 | 11.80 | 7.64 | 5.00 | 2.46 | — |
| $GeO_2$ | 0.94 | 1.87 | 4.61 | 6.85 | 13.31 | 17.41 | 21.37 | 25.19 |

TABLE 3
COMPOSITION OF $Bi_2O_3.SiO_2.GeO_2.PbO$ GLASSES

| | Weight % of Oxide | | |
|---|---|---|---|
| | A | B | C |
| $Bi_2O_3$ | 82.15 | 79.05 | 74.81 |
| $SiO_2$ | 13.24 | 7.64 | — |
| $GeO_2$ | 4.61 | 13.31 | 25.19 |
| PbO | 2.70 | 2.70 | 2.70 |

EXAMPLES 1–4

Glasses as described in Table 1 were incorporated into series of four conductor paste compositions and screen printed by the methods described above. From the data given in Table 4, it can be seen that glasses with 2.6 to 5.1 weight percent lead monoxide exhibited high adhesion values (25–27 newtons) and glasses with no lead oxide or high amounts (greater than 5.1 weight percent) gave lower adhesion values (21 newtons).

TABLE 4

| EXAMPLE NO. | 1 | 2 | 3 | 4 | Control |
|---|---|---|---|---|---|
| | Weight % | | | | |
| Ag | 49.5 | 49.5 | 49.5 | 49.5 | 49.5 |
| Pd | 16.5 | 16.5 | 16.5 | 16.5 | 16.5 |
| Glass A, Table 1 | 3.0 | — | — | — | — |
| B | — | 3.0 | — | — | — |
| C | — | — | 3.0 | — | — |
| D | — | — | — | 3.0 | — |
| Control Glass, | — | — | — | — | 3.0 |

TABLE 4-continued

| EXAMPLE NO. | 1 | 2 | 3 | 4 | Control |
|---|---|---|---|---|---|
| Table 1 | | | | | |
| ZnO | 3.0 | 3.0 | 3.0 | 3.0 | 3.0 |
| $Bi_2O_3$ | 6.0 | 6.0 | 6.0 | 6.0 | 6.0 |
| Organic Vehicle | 22.0 | 22.0 | 22.0 | 22.0 | 22.0 |
| Performance | | | | | |
| Aged Adhesion, Newtons, After 5 Fires (850°) | 25.0 | 27.0 | 21.0 | 21.0 | 21.0 |
| Resistivity, mohms/□/mil | 13.3 | 13.3 | 13.5 | 12.5 | 11.4 |
| Solderability | Good | Exc. | Good | Fair | Exc. |

EXAMPLES 5-10

To demonstrate the effect of added lead monoxide (instead of incorporating it into the glass matrix), a series of six compositions was made using the Control glass (Table 1) and added amounts of PbO. Table 5 shows that added lead oxide gave no improvement in aged adhesion and caused a noticeable degradation in solderability. Therefore, the net result of adding lead oxide as a crystalline material separate from the glass was undesirable.

TABLE 5

| EXAMPLE NO. | 5 | 6 | 7 | 8 | 9 | 10 |
|---|---|---|---|---|---|---|
| Weight % | | | | | | |
| Ag | 49.5 | 49.5 | 49.5 | 49.5 | 49.5 | 49.5 |
| Pd | 16.5 | 16.5 | 16.5 | 16.5 | 16.5 | 16.5 |
| Control Glass, Table 1 | 3.0 | 3.0 | 3.0 | 3.0 | 3.0 | 3.0 |
| PbO | 0 | 0.2 | 0.4 | 0.6 | 0.8 | 1.0 |
| ZnO | 3.0 | 2.8 | 2.6 | 2.4 | 2.2 | 2.0 |
| $Bi_2O_3$ | 6.0 | 6.0 | 6.0 | 6.0 | 6.0 | 6.0 |
| Organic Vehicle | 22.0 | 22.0 | 22.0 | 22.0 | 22.0 | 22.0 |
| Performance | | | | | | |
| Aged Adhesion, Newtons, After 5 Fires (850°) | 21.0 | 20.0 | 18.0 | 21.0 | 20.0 | 21.0 |
| Resistivity, mohms/□/mil | 13.2 | 12.8 | 11.4 | 12.1 | 11.2 | 11.0 |
| Solderability | Good | Fair | Fair | Fair | Fair | Poor |

EXAMPLES 11-18

In order to achieve consistently high aged adhesion, good solderability and low resistivity, a further series of conductor compositions was prepared in which the amounts of glass, ZnO and $Bi_2O_3$ were varied. The data in Table 6 and 7 show that the level of ZnO controls the resistivity value obtained, i.e., lower ZnO levels give lower resistivity. The ratio of bismuthate glass to bismuth oxide seems to control the aged adhesion and solderability. The best combination of properties was achieved with Example 17, Table 7, i.e., with 7% Glass A (Table 1), 1% ZnO and 4% $Bi_2O_3$.

TABLE 6

| EXAMPLE NO. | 11 | 12 | 13 | 14 |
|---|---|---|---|---|
| Weight % | | | | |
| Ag | 49.5 | 49.5 | 49.5 | 49.5 |
| Pd | 16.5 | 16.5 | 16.5 | 16.5 |
| Glass A, Table 1 | 4.0 | 5.0 | 3.0 | 4.0 |
| ZnO | 2.0 | 1.0 | 2.0 | 1.0 |
| $Bi_2O_3$ | 6.0 | 6.0 | 7.0 | 7.0 |
| Organic Vehicle | 22.0 | 22.0 | 22.0 | 22.0 |
| Performance | | | | |
| Aged Adhesion, Newtons, After 5 Fires (850°) | 22.0 | 24.0 | 19.0 | 21.0 |
| Resistivity, mohms/□/mil | 13.0 | 10.8 | 12.7 | 12.0 |
| Solderability | Fair | Fair | Good | Fair |

TABLE 7

| EXAMPLE NO. | 15 | 16 | 17 | 18 |
|---|---|---|---|---|
| Weight % | | | | |
| Ag | 49.5 | 49.5 | 49.5 | 49.5 |
| Pd | 16.5 | 16.5 | 16.5 | 16.5 |
| Glass A, Table 1 | 5.0 | 6.0 | 7.0 | 8.0 |
| ZnO | 1.0 | 1.0 | 1.0 | 1.0 |
| $Bi_2O_3$ | 6.0 | 5.0 | 4.0 | 3.0 |
| Organic Vehicle | 22.0 | 22.0 | 22.0 | 22.0 |
| Performance | | | | |
| Aged Adhesion, Newtons, After 5 Fires (850°) | 27.0 | 26.0 | 28.0 | 27.0 |
| Resistivity, mohms/□/mil | 9.9 | 9.5 | 9.7 | 9.6 |
| Solderability | Good | Good | Good | Good |

EXAMPLES 19-26

$Bi_2O_3.SiO_2.GeO_2$ glasses have also been found to be very useful in microcircuit conductor compositions. Several such glasses have been used in conjunction with added $Bi_2O_3$ and ZnO in the manner described above. Table 8 lists compositions using these glasses and gives their relevant properties. Example 21, Table 8, exhibits the highest aged adhesion values and uses Glass C, Table 2. A repeat experiment using a different lot of silver to demonstrate possible performance variations gave essentially the same adhesion values.

Example 23, Table 8, which contains Glass E, Table 2, exhibited excellent solderability, but aged adhesion was lower (13 newtons). A repeat experiment gave significantly higher adhesion (23 newtons). It appears that this composition is more sensitive to raw material variations than Example 21, Table 8.

TABLE 8

| EXAMPLE NO. | 19 | 20 | 21 | 22 | 23 | 24 | 25 | 26 | Control |
|---|---|---|---|---|---|---|---|---|---|
| Weight % | | | | | | | | | |
| Ag | 49.5 | 49.5 | 49.5 | 49.5 | 49.5 | 49.5 | 49.5 | 49.5 | 49.5 |
| Pd | 16.5 | 16.5 | 16.5 | 16.5 | 16.5 | 16.5 | 16.5 | 16.5 | 16.5 |
| Glass A, Table 2 | 3.0 | — | — | — | — | — | — | — | — |
| B | — | 3.0 | — | — | — | — | — | — | — |
| C | — | — | 3.0 | — | — | — | — | — | — |
| D | — | — | — | 3.0 | — | — | — | — | — |
| E | — | — | — | — | 3.0 | — | — | — | — |
| F | — | — | — | — | — | 3.0 | — | — | — |
| G | — | — | — | — | — | — | 3.0 | — | — |
| H | — | — | — | — | — | — | — | 3.0 | — |
| Glass A, Table 1 | — | — | — | — | — | — | — | — | 3.0 |
| ZnO | 3.0 | 3.0 | 3.0 | 3.0 | 3.0 | 3.0 | 3.0 | 3.0 | 3.0 |
| $Bi_2O_3$ | 6.0 | 6.0 | 6.0 | 6.0 | 6.0 | 6.0 | 6.0 | 6.0 | 6.0 |

TABLE 8-continued

| EXAMPLE NO. | 19 | 20 | 21 | 22 | 23 | 24 | 25 | 26 | Control |
|---|---|---|---|---|---|---|---|---|---|
| Organic Vehicle | 22.0 | 22.0 | 22.0 | 22.0 | 22.0 | 22.0 | 22.0 | 22.0 | 22.0 |
| | | | | | Performance | | | | |
| Aged Adhesion, Newtons, After 5 Fires (850°) | 24.0 | 21.0 | 32.0 29.0* | 20.0 | 13.0 23.0* | 22.0 | 21.0 | 24.0 | 21.0 |
| Resistivity, mohms/□/mil | 16.0 | 14.0 | 15.0 | 15.0 | 15.0 | 14.0 | 14.0 | 14.0 | 13.0 |
| Solderability | Fair | Exc. | Fair | Good | Exc. | Fair | Fair | Fair | Good |

*Repeat experiment using a different silver lot.

EXAMPLES 27-32

Table 9 lists conductor compositions which used various glasses in the $Bi_2O_3.SiO_2.GeO2.PbO$ system (see Table 3). Examples 27-29 of Table 9 gave significantly higher aged adhesion values Examples 30-32. This demonstrates that 7:1:4 (weight ratio of glass:-ZnO:Bi$_2$O$_3$) binder ratios give more reliable adhesion values than 3:1:3 (glass:ZnO:Bi$_2$O$_3$) ratios. Examples 27-29 of Table 9 also showed a trend of decreasing solderability which may be due to higher GeO2 content or to higher PbO/Bi$_2$O$_3$ ratio in the glasses. Under the conditions of this experiment, Example 27 of Table 9 gave better performance than the rest.

TABLE 9

| EXAMPLE NO. | 27 | 28 | 29 | 30 | 31 | 32 |
|---|---|---|---|---|---|---|
| | Weight % | | | | | |
| Ag | 49.5 | 49.5 | 49.5 | 49.5 | 49.5 | 49.5 |
| Pd | 16.5 | 16.5 | 16.5 | 16.5 | 16.5 | 16.5 |
| Glass A, Table 3 | 7.0 | — | — | 3.0 | — | — |
| B | — | 7.0 | — | — | 3.0 | — |
| C | — | — | 7.0 | — | — | 3.0 |

TABLE 9-continued

| EXAMPLE NO. | 27 | 28 | 29 | 30 | 31 | 32 |
|---|---|---|---|---|---|---|
| ZnO | 1.0 | 1.0 | 1.0 | 3.0 | 3.0 | 3.0 |
| Bi$_2$O$_3$ | 4.0 | 4.0 | 4.0 | 6.0 | 6.0 | 6.0 |
| Organic Vehicle | 22.0 | 22.0 | 22.0 | 22.0 | 22.0 | 22.0 |
| | Performance | | | | | |
| Aged Adhesion, Newtons, After 5 Fires (850°) | 25.0 | 20.0 | 24.0 | 12.0 | 8.0 | 12.0 |
| Resistivity, mohms/□/mil | 11.0 | 10.0 | 14.0 | 13.1 | 13.0 | 13.0 |
| Solderability | Exc. | Fair | Poor | Exc. | Exc. | Exc. |

I claim:

1. A glass having a composition corresponding to the formula $Bi_4Si_{3-x}Ge_xO_{12}$, wherein $x=0.1-2.9$ having dissolved therein 0-100 pph by wt. PbO, basis glass.

2. The glass of claim 1 in which x is 0.2-2 having dissolved therein 1-20 pph by wt. PbO.

3. An inorganic binder composition consisting essentially of an admixture of finely divided particles of:
   A. The glass of claim 1,
   B. 0-100 pph by wt. of Bi$_2$O$_3$, and
   C. 4-100 by wt. of ZnO basis glass.

* * * * *